United States Patent
Park et al.

(10) Patent No.: US 11,823,999 B2
(45) Date of Patent: *Nov. 21, 2023

(54) SEMICONDUCTOR DEVICE AND METHOD OF MANUFACTURING THE SAME

(71) Applicant: SK hynix Inc., Icheon-si (KR)

(72) Inventors: Hae Chan Park, Cheongju-si (KR); Jang Won Kim, Hanam-si (KR); Jae Taek Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 27 days.

This patent is subject to a terminal disclaimer.

(21) Appl. No.: 17/491,775

(22) Filed: Oct. 1, 2021

(65) Prior Publication Data

US 2022/0020686 A1 Jan. 20, 2022

Related U.S. Application Data

(63) Continuation of application No. 16/696,013, filed on Nov. 26, 2019, now Pat. No. 11,145,594.

(30) Foreign Application Priority Data

Jul. 23, 2019 (KR) ........................ 10-2019-0089139

(51) Int. Cl.
*H01L 23/522* (2006.01)
*H01L 23/528* (2006.01)
(Continued)

(52) U.S. Cl.
CPC ...... *H01L 23/5226* (2013.01); *H01L 23/5283* (2013.01); *H10B 41/27* (2023.02);
(Continued)

(58) Field of Classification Search
CPC ............. H01L 23/5226; H01L 23/5283; H01L 27/11556; H01L 27/11582; H01L 27/2481;
(Continued)

(56) References Cited

U.S. PATENT DOCUMENTS 9,881,929 B1 1/2018 Ravikirthi et al.
9,911,751 B2 3/2018 Kwon et al.
(Continued)

FOREIGN PATENT DOCUMENTS

CN 102456675 A 5/2012
CN 104425505 A 3/2015
(Continued)

*Primary Examiner* — Calvin Y Choi
(74) *Attorney, Agent, or Firm* — WILLIAM PARK & ASSOCIATES LTD.

(57) ABSTRACT

The present technology relates to a semiconductor device and a method of manufacturing the same. The semiconductor device includes a first stack including first interlayer insulating layers and first conductive patterns which are alternately stacked with one another, a second stack including second interlayer insulating layers and second conductive patterns which are alternately stacked with one another on the first stack, a plurality of channel plugs vertically formed through the first stack and the second stack, and at least one dummy plug vertically formed through the second without passing through the first stack.

12 Claims, 11 Drawing Sheets

(51) Int. Cl.
*H10B 41/27* (2023.01)
*H10B 43/27* (2023.01)
*H10B 63/00* (2023.01)
*H10N 70/20* (2023.01)

(52) U.S. Cl.
CPC ............ *H10B 43/27* (2023.02); *H10B 63/84* (2023.02); *H10N 70/231* (2023.02)

(58) Field of Classification Search
CPC ............... H01L 45/06; H01L 21/76837; H01L 21/76897; H01L 29/42324; H01L 29/66825; H01L 29/788; H10B 41/27; H10B 41/10; H10B 41/30; H10B 43/27; H10B 43/10; H10B 63/84; H10N 70/231
USPC ........................................................ 257/774
See application file for complete search history.

(56) References Cited

U.S. PATENT DOCUMENTS

| | | |
|---|---|---|
| 9,960,181 B1 | 5/2018 | Cui et al. |
| 11,145,594 B2 * | 10/2021 | Park .................... H01L 23/5226 |
| 2017/0098658 A1 | 4/2017 | Matsuda et al. |
| 2017/0179148 A1 | 6/2017 | Kwon et al. |
| 2017/0213846 A1 | 7/2017 | Lee |
| 2017/0338241 A1 | 11/2017 | Lee |
| 2017/0352552 A1 | 12/2017 | Lee |

FOREIGN PATENT DOCUMENTS

| | | |
|---|---|---|
| CN | 108933142 A | 12/2018 |
| CN | 109103199 A | 12/2018 |
| CN | 109427805 A | 3/2019 |
| KR | 1020120003351 A | 1/2012 |
| KR | 1020160029981 A | 3/2016 |

* cited by examiner

SEMICONDUCTOR DEVICE AND METHOD OF MANUFACTURING THE SAME

CROSS-REFERENCE TO RELATED APPLICATION

The present application is a continuation application of U.S. patent application Ser. No. 16/696,013, filed on Nov. 26, 2019, and claims priority under 35 U.S.C. § 119(a) to Korean patent application number 10-2019-0089139 filed on Jul. 23, 2019, the entire disclosure of which is incorporated herein by reference in its entirety.

BACKGROUND

1. Field of Invention

The present disclosure relates to an electronic device, and more particularly, to a three-dimensional semiconductor device and a method of manufacturing the same.

2. Description of Related Art

A non-volatile memory element is a memory element in which stored data is maintained even when a power supply is cut off. Recently, as improvement of a degree of integration of a two-dimensional non-volatile memory element that forms a memory cell in a single layer on a substrate has reached a limit, a three-dimensional non-volatile memory element that vertically stack memory cells on a substrate have been proposed.

The three-dimensional non-volatile memory element includes interlayer insulating films and gate electrodes which are alternately stacked, and channel films passing through the interlayer insulating films and the gate electrodes, and memory cells are stacked along the channel films. Various structures and manufacturing methods have been developed to improve operation reliability and enhance a manufacturing yield of the non-volatile memory elements having such a three-dimensional structure.

SUMMARY

An embodiment of the present disclosure provides a semiconductor device and a method of manufacturing the same capable of improving a bridge phenomenon of word lines.

A semiconductor device according to an embodiment of the present disclosure includes a first stack including first interlayer insulating layers and first conductive patterns which are alternately stacked with one another, a second stack including second interlayer insulating layers and second conductive patterns which are alternately stacked with one another on the first stack, a plurality of channel plugs vertically formed through the first stack and the second stack, and at least one dummy plug vertically formed through the second stack without passing through the first stack.

A semiconductor device according to an embodiment of the present disclosure includes a first stack including first interlayer insulating layers and first conductive patterns which are alternately stacked with one another, a second stack including second interlayer insulating layers and second conductive patterns which are alternately stacked with one another on the first stack, a plurality of channel plugs vertically formed through the first stack and the second stack, and at least one dummy plug arranged in an outermost corner region of a region where the plurality of channel plugs are arranged. A length of the dummy plug is shorter than a length of the plurality of channel plugs.

A semiconductor device according to an embodiment of the present disclosure includes interlayer insulating films and word line films with are alternately stacked with one another, a plurality of channel plugs formed through the interlayer insulating layers and the word line layers, and at least one dummy plug arranged in an outermost corner region of a region where the plurality of channel plugs are arranged. The dummy plug passes through at least one interlayer insulating film of the interlayer insulating films and at least one word line film of the word line films.

A method of manufacturing a semiconductor device according to an embodiment of the present disclosure includes forming a first stack, forming a plurality of first channel holes passing through the stack, filling the plurality of first channel holes with a reflective metal, forming a second stack on the first stack, forming a plurality of second channel holes through the second stack to expose the reflective metal and at least one dummy hole passing through the second stack, removing the reflective metal, and forming channel plugs in the first channel holes and the second channel holes, and forming at least one dummy plug in the at least one dummy hole.

The present technology eliminates a lower hole for forming the dummy plug that passes through a lower stack in a process of forming the dummy plug formed at the outermost region of the memory block. Therefore, a bridge phenomenon of the word lines by a metal material remaining in the lower hole for forming the dummy plug may be improved.

DETAILED DESCRIPTION

Specific structural or functional descriptions of embodiments according to the concepts which are disclosed in the present specification or application are illustrated only to describe the embodiments according to the concept of the present disclosure. The embodiments according to the concepts of the present disclosure may be carried out in various forms and the descriptions are not limited to the embodiments described in the present specification or application.

Because various modifications and changes may be applied to the embodiments according to the concepts of the present disclosure and the embodiments according to the concept of the present disclosure may have various forms, the specific embodiments are illustrated in the drawings and described in the present specification or application. However, it should be understood that the embodiments according to the concepts of the present disclosure are not construed as limited to a specific disclosure form and includes all changes, equivalents, or substitutes that do not depart from the spirit and technical scope of the present disclosure.

While terms such as "first", "second", and/or the like may be used to describe various components, such components should not be limited to the above-described terms. The above-described terms may be used only to distinguish one component from another component. For example, a first component may be referred to as a second component and similarly, a second component may be referred to as a first component without departing from the scope according to the concept of the present disclosure.

It should be understood that when a component is referred to as being "connected" or "coupled" to another component, the component may be directly connected or coupled to the other element or an intervening component may also be present. In contrast, it should be understood that when a component is referred to as being "directly connected" or "directly coupled" to another component, no intervening component is present. Other expressions describing relationships between components such as "~between," "immediately ~between" or "adjacent to ~", "directly adjacent to ~", and the like should be construed similarly.

The terms used in the present specification are merely used to describe a specific embodiment, and are not intended to limit the present disclosure. Singular expression includes a plural expression, unless the context clearly indicates otherwise. In the present specification, it should be understood that a term "include", "have", or the like indicates that a feature, a number, a step, an operation, a component, a part, or a combination thereof described in the present specification is present, but do not exclude a possibility of presence or addition of one or more other features, numbers, steps, operations, components, parts, or combinations thereof.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in the present specification, should not be construed as having idealistic or excessively formal meanings.

In describing the embodiment, description of technical contents which are well known in the technical field of the present disclosure and are not directly related to the present disclosure will be omitted. This intends to disclose the gist of the present disclosure more clearly by omitting unnecessary description.

Hereinafter, embodiments of the present disclosure are described in detail with reference to the accompanying drawings, so that those skilled in the art to which the present disclosure pertains may easily carry out the technical spirit of the present disclosure.

Figure 1A:
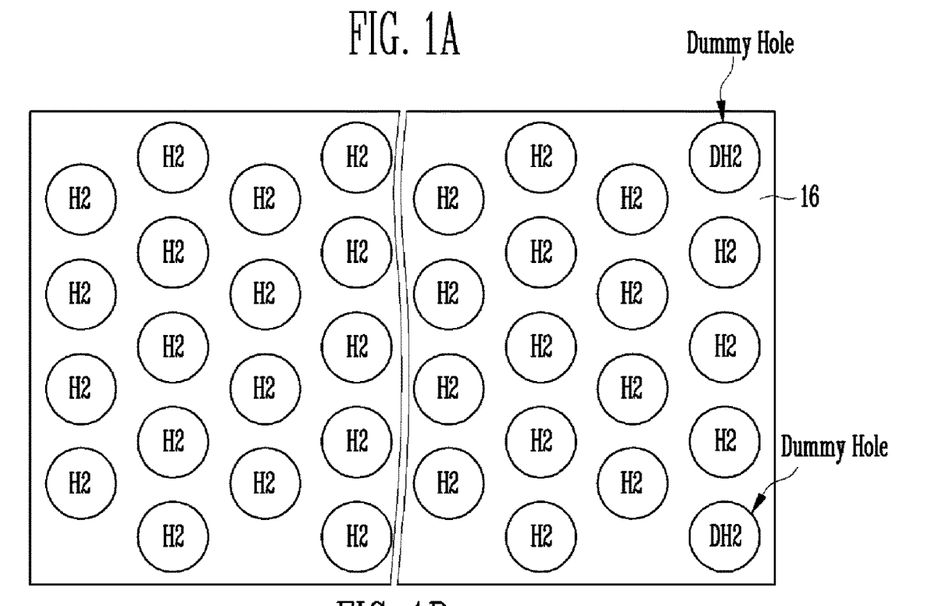
FIGS. 1A and 1B are diagrams for describing a process of forming a channel hole and a dummy hole.
Figure 1B:
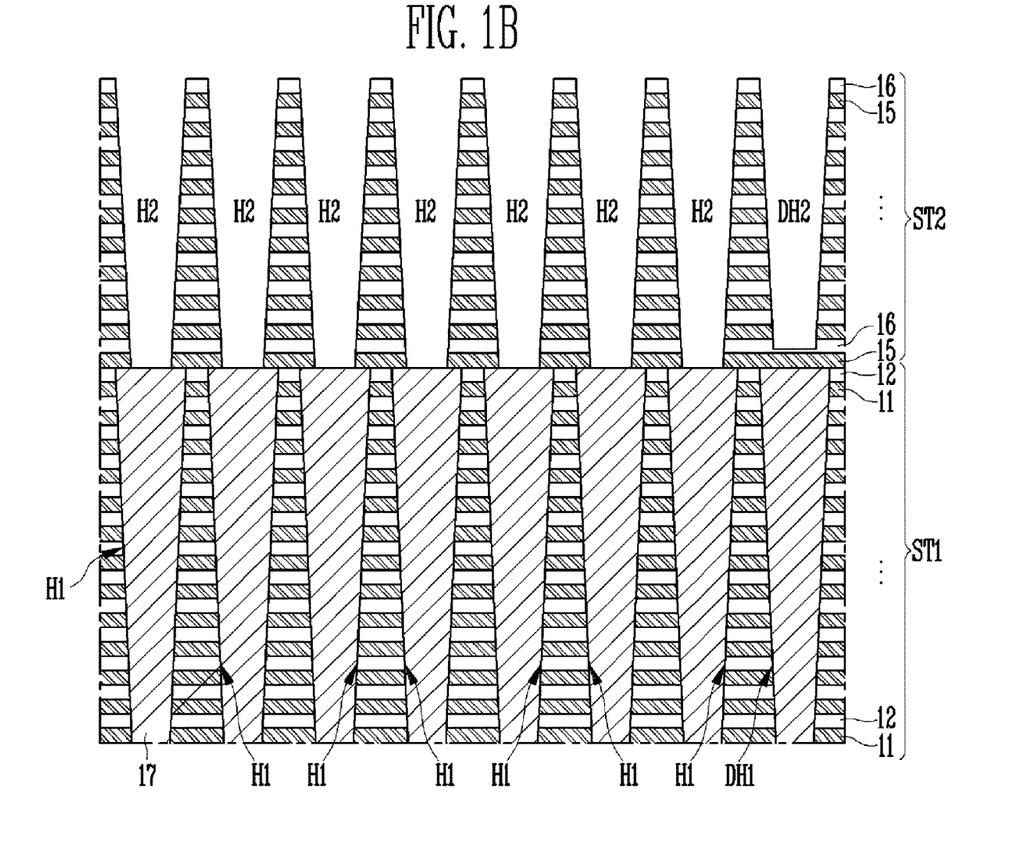

FIGS. 1A and 1B are diagrams for describing a process of forming a channel hole and a dummy hole.

Referring to FIGS. 1A and 1B, first material films 11 and second material films 12 are alternately stacked on a lower structure to form a first stack ST1. Thereafter, portions of the first material films 11 and the second material films 12 are etched to form first channel holes H1 and first dummy holes DH1 passing through the first stack ST1.

Thereafter, a reflective metal 17 used as an overlay measurement film is formed in the first channel holes H1 and the first dummy hole DH1, and a third material film 15 and a fourth material film are stacked on the first stack ST1 to form a second stack ST2.

Thereafter, portions of the third material films 15 and the fourth material films 16 are etched to form second channel holes H2 and second dummy holes DH2 exposing the reflective metal 17. In addition, the exposed reflective metal 17 is removed to form channel holes configured of the first channel holes H1 and the second channel holes H2 and a dummy hole configured of the first dummy hole DH1 and the second dummy hole DH2.

In the process of forming the channel hole and the dummy hole described above, the dummy hole may be formed in an edge region of a plurality of channel holes, and thus, may have a critical dimension less than a critical dimension of the dummy hole, which is a target, in a process of patterning the dummy hole. In this case, in a process of etching the second dummy hole DH2, the reflective metal 17 formed in the first dummy hole DH1 may not be etched sufficiently to expose the reflective metal 17, and thus, the reflective metal 17 may remain in the first dummy hole DH1 in a subsequent process of removing the reflective metal 17.

Thereafter, the first material film 11 of the first stack ST1 is removed and word line conductive films are formed in a region where the first material film 11 is removed. However, when the reflective metal 17 remains in the first dummy hole DH1, the word line conductive films are electrically connected to each other by the reflective metal 17 and thus a bridge phenomenon occurs.

Figure 2A:
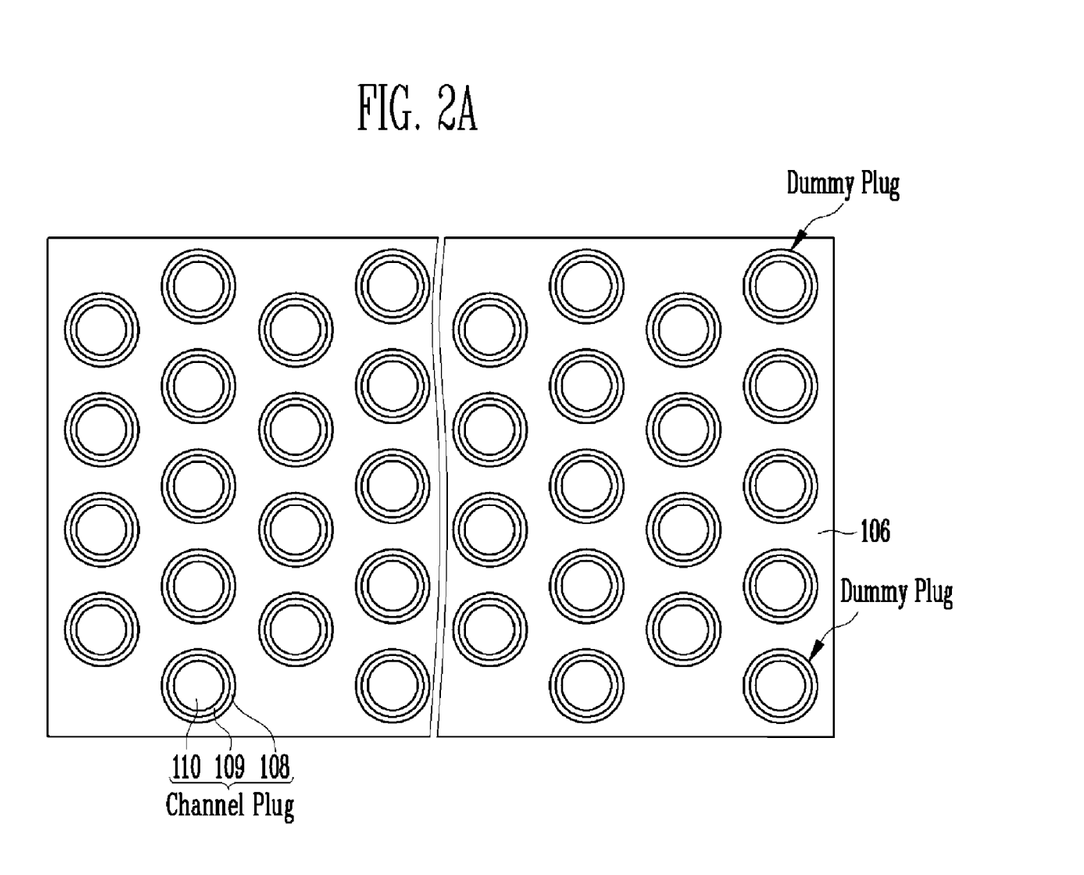
FIGS. 2A and 2B are diagrams for describing a semiconductor device according to an embodiment of the present disclosure.
Figure 2B:
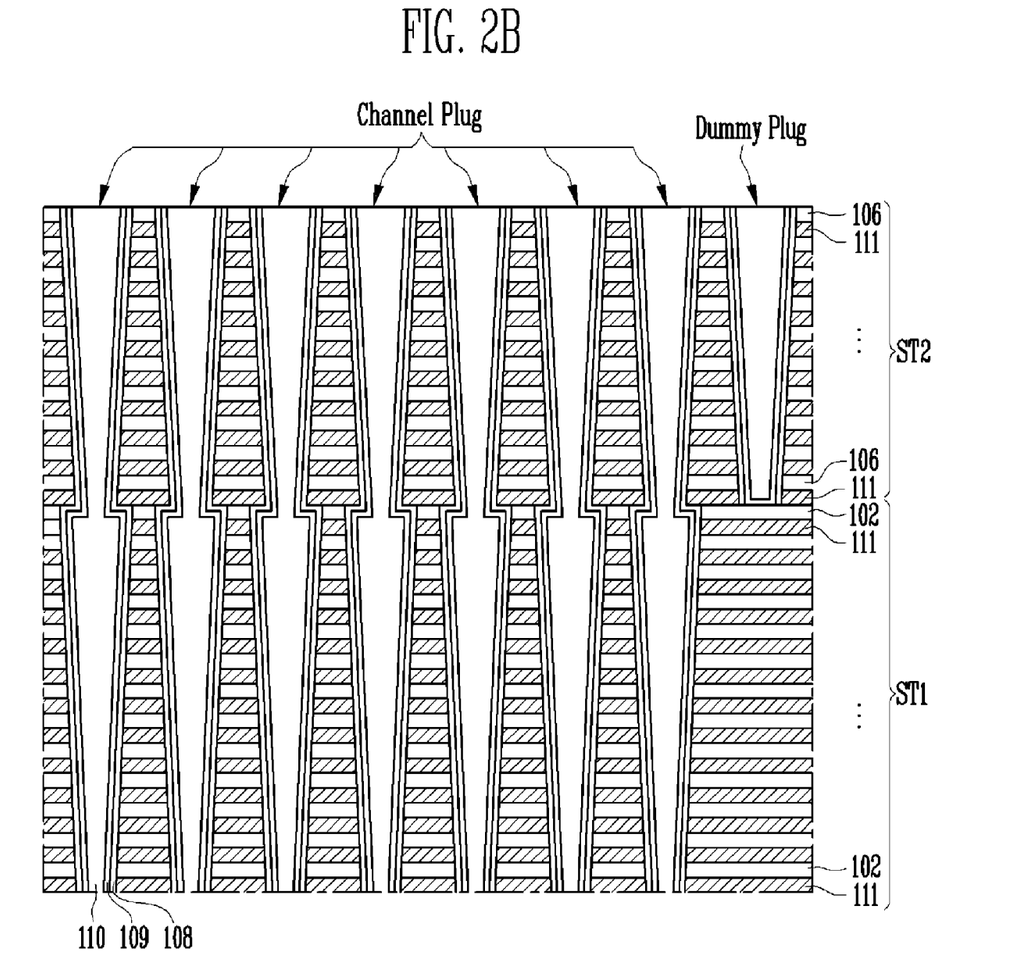

FIGS. 2A and 2B are diagrams for describing a semiconductor device according to an embodiment of the present disclosure.

Referring to FIG. 2A, the semiconductor device includes a plurality of channel plugs and at least one dummy plug. The plurality of channel plugs may be regularly arranged spaced apart from each other by a predetermined distance, and the dummy plug may be formed in the outermost corner region of a region where the plurality of channel plugs are arranged. Each of the plurality of channel plugs and the dummy plug may include memory patterns 108, a channel pattern 109, and a gap fill film 110.

Referring to FIG. 2B, in the semiconductor device, a second stack ST2 may be stacked on a first stack ST1, and the plurality of channel plugs may be vertically arranged through the first stack ST1 and the second stack ST2. The dummy plug may be disposed in the outermost corner region of the region where the plurality of channel plugs are arranged, and the dummy plug may be vertically arranged through the second stack ST2. At this time, the dummy plug does not pass through the first stack ST1. That is, the dummy plug is formed through only the second stack ST2 formed on a structure in which the first stack ST1 and the second stack ST2 are stacked, and a lower portion of the dummy plug is in contact with the uppermost film of the first stack ST1. Therefore, a vertical length of the dummy plug is shorter than a vertical length of the plurality of channel plugs.

The first stack ST1 is a structure in which word line conductive film 111 and an interlayer insulating film 102 are alternately stacked, and the second stack ST2 is a structure in which the word line conductive film 111 and an interlayer insulating film 106 are alternately stacked on the first stack ST1.

FIGS. 3A to 5A and 3B to 5B are diagrams for describing a method of manufacturing a semiconductor device according to an embodiment of the present disclosure. FIGS. 3A to 5A are layouts and FIGS. 3B to 5B are cross-sectional views.

Referring to FIGS. 3A to 5A and 3B to 5B, the method of manufacturing the semiconductor device according to an embodiment of the present disclosure is described as follows.

Figure 3A:
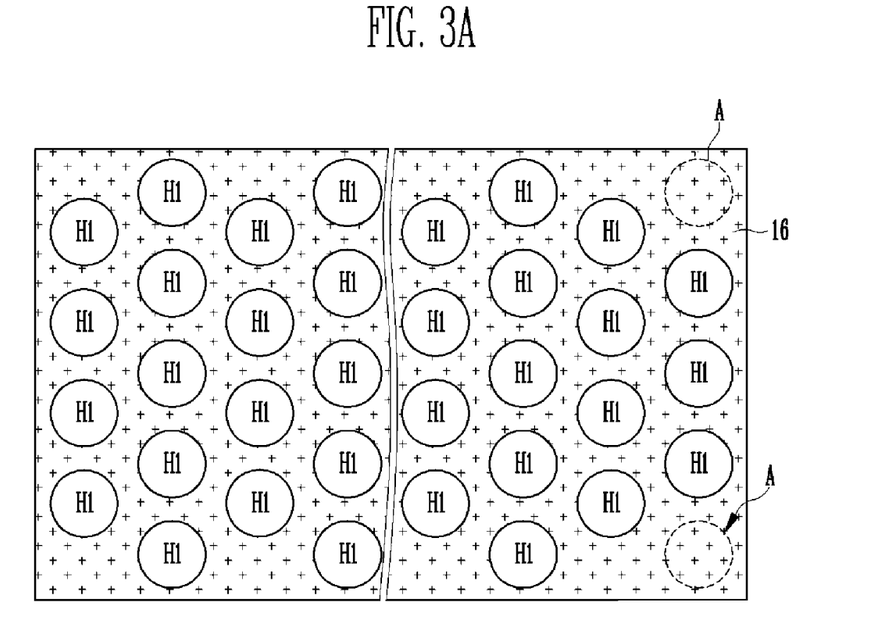
FIGS. 3A to 3B, 4A to 4B, and 5A to 5B are diagrams for describing a method of manufacturing a semiconductor device according to an embodiment of the present disclosure.
Figure 3B:
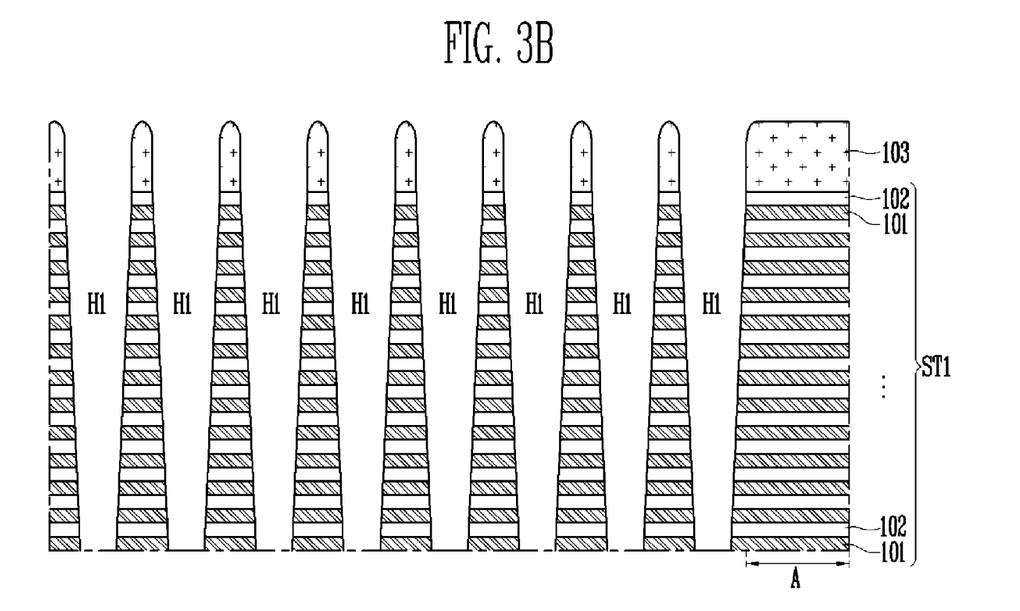

Referring to FIGS. 3A and 3B, a first stack ST1 in which first material films 101 and second material films 102 are alternately stacked is formed. For example, the first stack ST1 is formed on a substrate (not shown) on which a lower substructure such as a source structure and a pipe structure is formed. The substrate may include a cell region in which a memory string is located and a peripheral region in which a circuit for driving the memory string is located, and the first stack ST1 may be located in the cell region. In addition, the first stack ST1 may be a cell structure for forming stacked memory cells. The lower substructure may be variously changed according to a structure of the cell string to be formed.

The first material films 101 may be for forming conductive films such as a word line, a select line, and a pad, and the second material films 102 may be for insulating the stacked conductive films.

The first material films 101 are formed of a material having an etching selectivity higher than that of the second material films 102. For example, the first material films 101 may include a sacrificial material such as nitride, and the second material films 102 may include an insulating material such as an oxide. As another example, the first material films 101 may include a conductive material such as polysilicon or tungsten, and the second material films 102 may include an insulating material such as an oxide. As still another example, the first material films 101 may include a conductive material such as doped polysilicon, and the second material films 102 may include a sacrificial material such as un-doped polysilicon. When the first material films 101 include a conductive material such as polysilicon, tungsten, or doped polysilicon, at least lowermost one of the first material films 101 may be a lower select line and the remaining first material films 101 may be the word lines.

Next, a first mask pattern 103 is formed on the first stack ST1. The first mask pattern 103 may include opening portions for forming channel plugs, and the opening portions may be distributed at uniform intervals. For example, the opening portions may be holes having a cross section of a circle, an ellipse, a quadrangle, a polygon, or the like. Because the first mask pattern 103 is used as a barrier for patterning a structure having a high aspect ratio, the first mask pattern 103 is formed to a sufficient thickness in consideration of loss in an etching process. At this time, the first mask pattern 103 on a region A in which the dummy plug is to be formed does not include an opening portion. That is, the region A in which the dummy plug is to be formed is covered by the first mask pattern 103.

Next, the first stack ST1 is etched using the first mask pattern 103 as a barrier to form first holes H1 passing through the first stack ST1. At this time, etching is prevented in the region A in which the dummy plug is to be formed by the first mask pattern 103, and thus a hole is not formed. Thereafter, the first mask pattern 103 is removed.

Figure 4A:
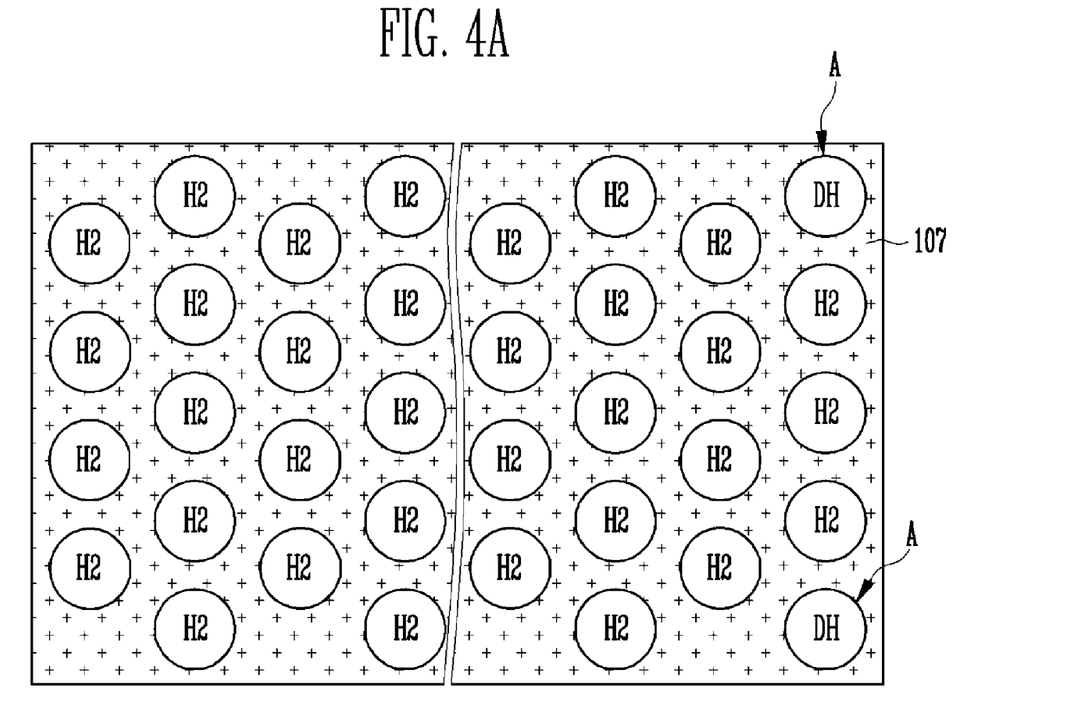
Figure 4B:
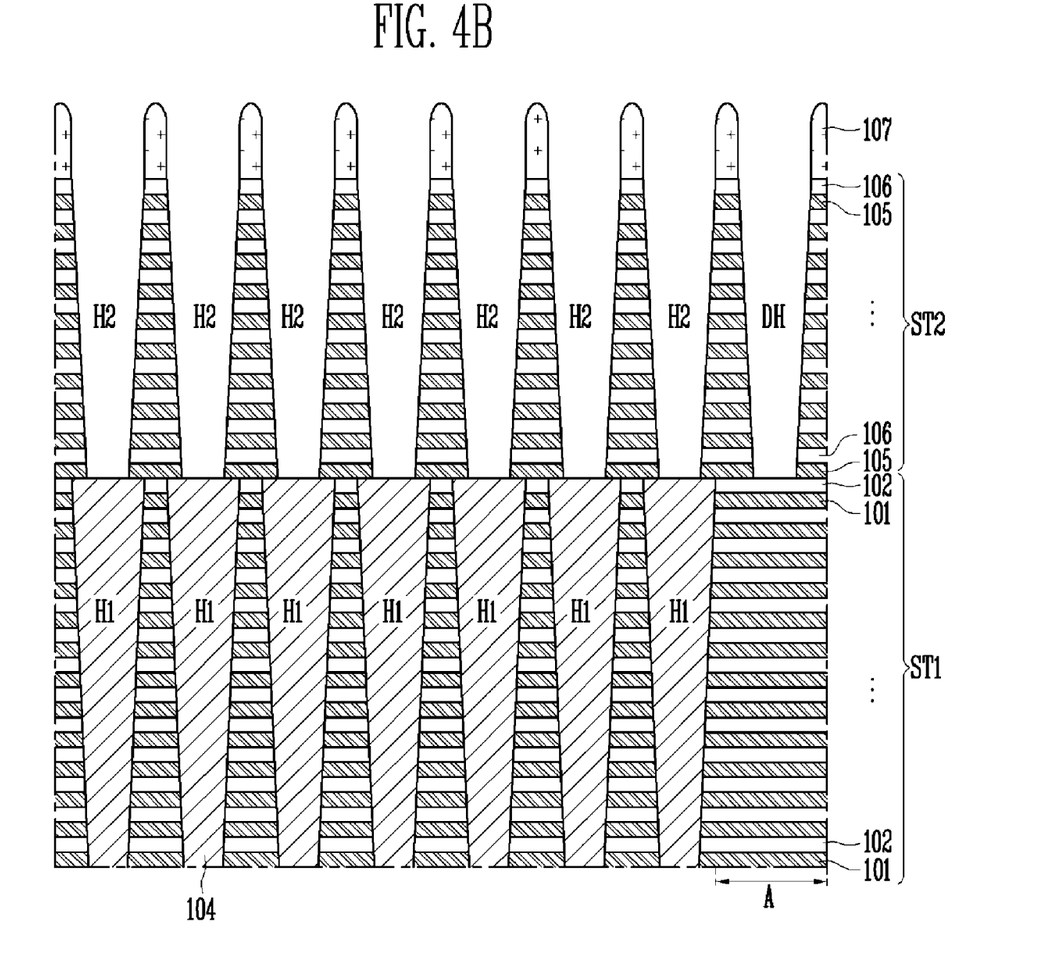

Referring to FIGS. 4A and 4B, after removing the first mask pattern, a reflective metal 104 is formed in the first channel holes H1. The reflective metal 104 may be formed of a material having an etching selectivity different from that of the first material films 101 and the second material films 102. For example, the reflective metal 104 may include tungsten. The reflective metal 104 may be used as an overlay measurement film. A process of filling the inside of the first channel holes H1 with the reflective metal 104 used as the overlay measurement film may be performed simultaneously with an overlay vernier forming process.

Next, a second stack ST2 in which third material films 105 and fourth material films 106 are alternately stacked is formed on the first stack ST1 on which the reflective metal 104 is formed. The third material films 105 may be formed of the same material as the first material films 101, and the fourth material films 106 may be formed of the same material as the second material films 102. Before forming the second stack ST2, an etch stop layer (not shown) may be formed on the first stack ST1 and the reflective metal 104. The etch stop layer prevents the first stack ST1 from being etched in a subsequent process of etching a dummy hole DH.

Next, second channel holes H2 and dummy holes DH passing through the second stack ST2 are formed. For example, after a second mask pattern 107 is formed on the second stack ST2, the second stack ST2 is etched using the second mask pattern 107 as a barrier to form the second channel holes H2 and the dummy hole DH. The second channel holes H2 are connected to the first channel holes H1, respectively, to expose the reflective metal 104. The dummy hole DH is formed through the second stack ST2 on the region A in which the dummy plug is to be formed. At this time, the dummy hole DH is formed on the first stack ST1, and preferably, the dummy hole DH is formed so that an upper portion of the first material film 101 formed on the uppermost portion of the first material films 101 included in the first stack ST1 is not exposed. That is, a lower portion of the dummy hole DH is formed to expose the second material films 102 of the uppermost portion included in the first stack ST1.

Figure 5A:
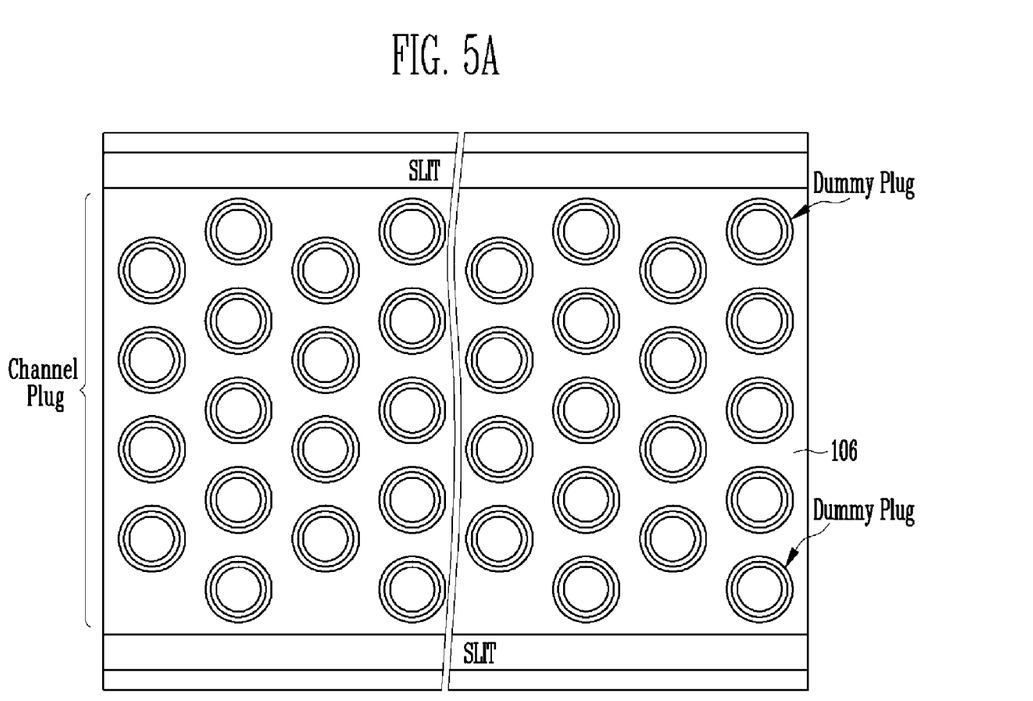
Figure 5B:
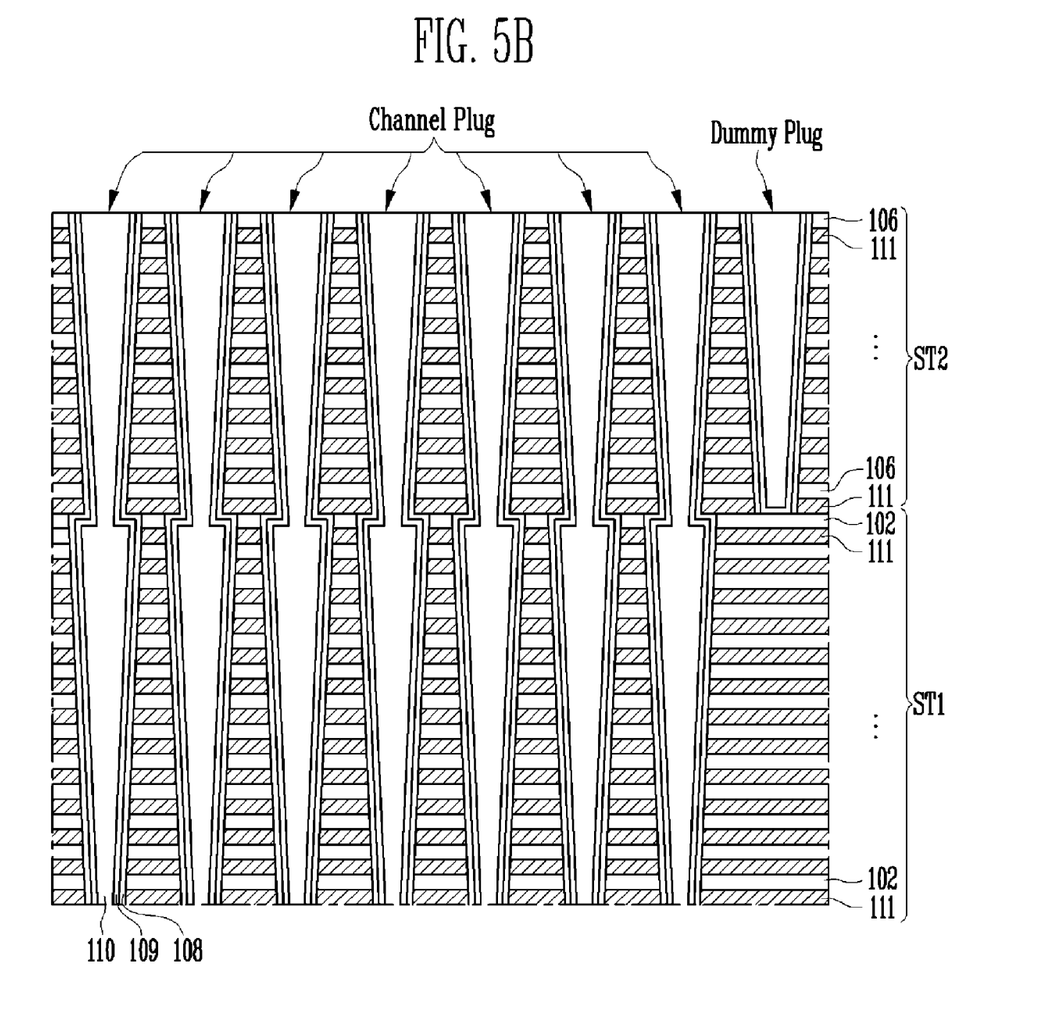

Referring to FIGS. 5A and 5B, the reflective metal exposed through the second channel holes H2 is removed. Thereafter, the channel patterns 109 are formed in the first channel holes and the second channel holes H1 and H2. For example, one channel pattern 109 is formed in the first channel hole H1 and the second channel hole H2 connected up and down. Before forming the channel patterns 109, the memory patterns 108 may be formed in the first channel hole H1 and the second channel hole H2. For example, the memory patterns 108 may include at least one of a charge blocking film, a data storage film, and a tunnel insulating film, and the data storage film may include a floating gate such as silicon, a charge trap material such as nitride, a phase change material, a nano-dot, and the like. In addition, the channel patterns 109 may be formed to be completely filled to a center region, or may be formed in a structure in the center region is opened, and the gap fill film 110 may be formed in the opened center region. The memory pattern 108, the channel pattern 109, and the gap fill film 110 formed in the first channel hole H1 and the second channel hole H2 may be defined as a channel plug.

In addition, when the channel plug is formed in the first channel hole H1 and the second channel hole H2, the memory pattern 108, the channel pattern 109, and the gap fill film 110 is formed in the dummy hole DH together. The memory pattern 108, the channel pattern 109, and the gap fill film 110 formed in the dummy hole DH may be defined as a dummy plug.

Next, the second stack ST2 and the first stack ST1 are etched to form slits SLIT extending in one direction. The slit SLIT may be formed between a plurality of memory blocks included in the semiconductor device. That is, a plurality of channel plugs and a dummy plug formed between slits SLIT adjacent to each other may be defined as one memory block. At this time, the dummy plug is formed in a region adjacent to the slits SLIT.

A sidewall of the first material film and the third material film included in the first stack ST1 is exposed through the slits SLIT, and the first material film and the third material film exposed through the slits SLIT are removed.

Next, the word line conductive films 111 are formed in a space from which the material film and the third material film are removed.

As described above, according to an embodiment of the present disclosure, a dummy hole is not formed in the first stack ST1 on the region A on which the dummy plug is to be formed by excluding a process of forming a dummy plug dummy hole in the process of forming the first channel hole H1. Therefore, the reflective metal does not remain in the first stack ST1 on the region A in which the dummy plug is to be formed, and thus, a bridge phenomenon between the word lines of the first stack ST1 does not occur.

In an embodiment of the present disclosure, the semiconductor device has been described as a structure in which the first stack ST1 and the second stack ST2 are stacked as an example, and the semiconductor device may be manufactured in a structure in which at least two stacks are sequentially stacked. For example, when the semiconductor device is manufactured in a structure in which a first stack, a second stack, and a third stack are sequentially stacked, the channel plugs may be formed through the first stack, the second stack, and the third stack, and the dummy plug may be formed through only the third stack or the second and third stacks disposed on an upper portion. Preferably, the dummy plug may be formed through only a stack that is stacked on the uppermost portion of a plurality of stacks.

Figure 6:
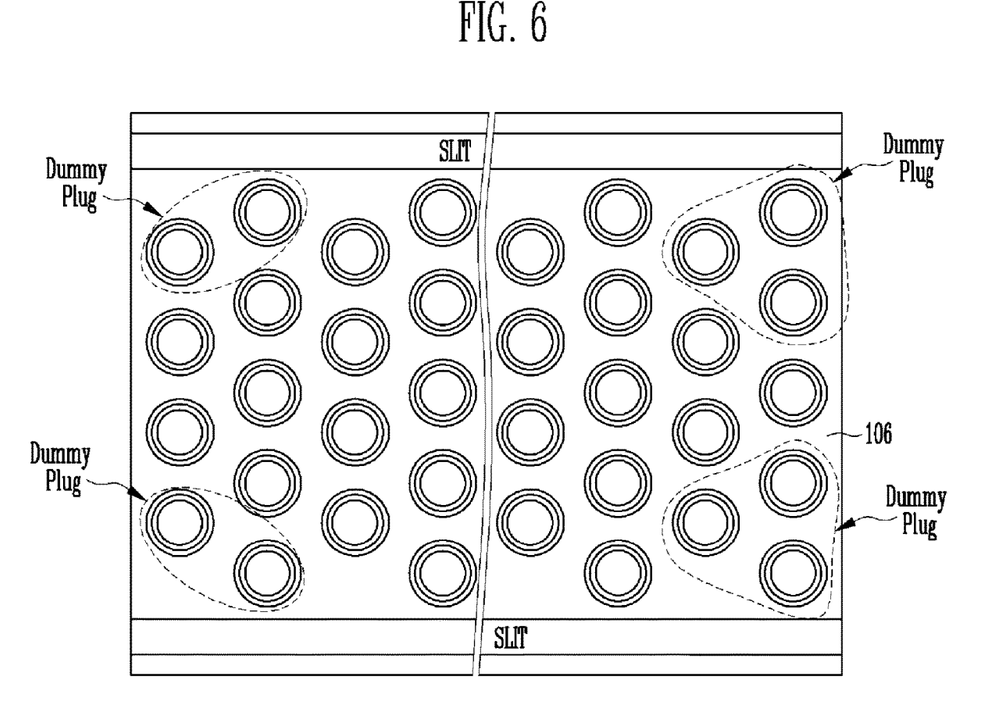
FIG. 6 is a diagram for describing a semiconductor device according to another embodiment of the present disclosure.

FIG. 6 is a diagram for describing a semiconductor device according to another embodiment of the present disclosure.

Referring to FIG. 6, one memory block disposed between two adjacent slits SLIT of the semiconductor device includes a plurality of channel plugs and at least one dummy plug. The plurality of channel plugs may be regularly arranged, and the at least one dummy plug may be formed in the outermost corner region of a region in which the plurality of channel plugs are arranged. Each of the plurality of channel plugs and the at least one dummy plug may include a memory pattern 108, a channel pattern 109, and a gap fill film 110.

As shown in FIG. 6, the at least one dummy plug may be formed in each outermost corner region.

In addition, the at least one dummy plug might be formed through only the second stack as in the method of manufacturing the semiconductor device described above.

Figure 7:
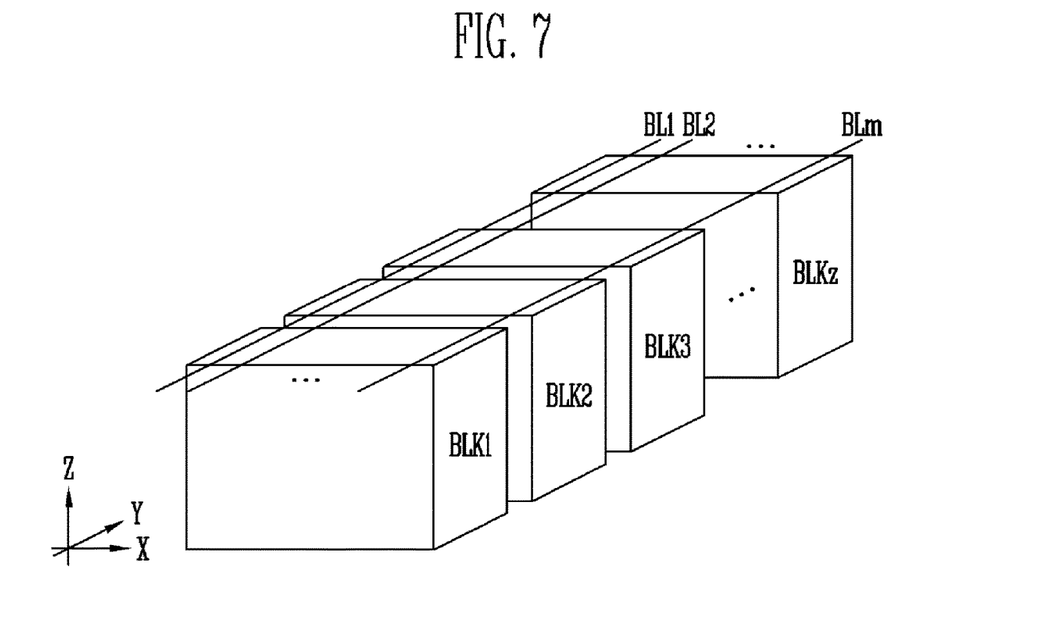
FIG. 7 is a diagram for describing memory blocks included in a semiconductor device according to an embodiment of the present disclosure.

FIG. 7 is a diagram for describing memory blocks included in a semiconductor device according to an embodiment of the present disclosure.

The semiconductor device may include a plurality of memory blocks BLK1 to BLKz. The memory blocks BLK1 to BLKz may be arranged to be spaced apart from each other along a direction Y in which bit lines BL1 to BLM extend.

For example, the first to z-th memory blocks BLK1 to BLKz may be arranged to be spaced apart from each other along a second direction Y, and may include a plurality of memory cells stacked along a third direction Z. At this time, the first to z-th memory blocks BLK1 to BLKz may be spaced apart from each other using a slit.

Each of the plurality of memory blocks BLK1 to BLKz may include the plurality of channel plugs and the dummy plugs as described above with reference to FIGS. 2A and 2B or 6.

Figure 8:
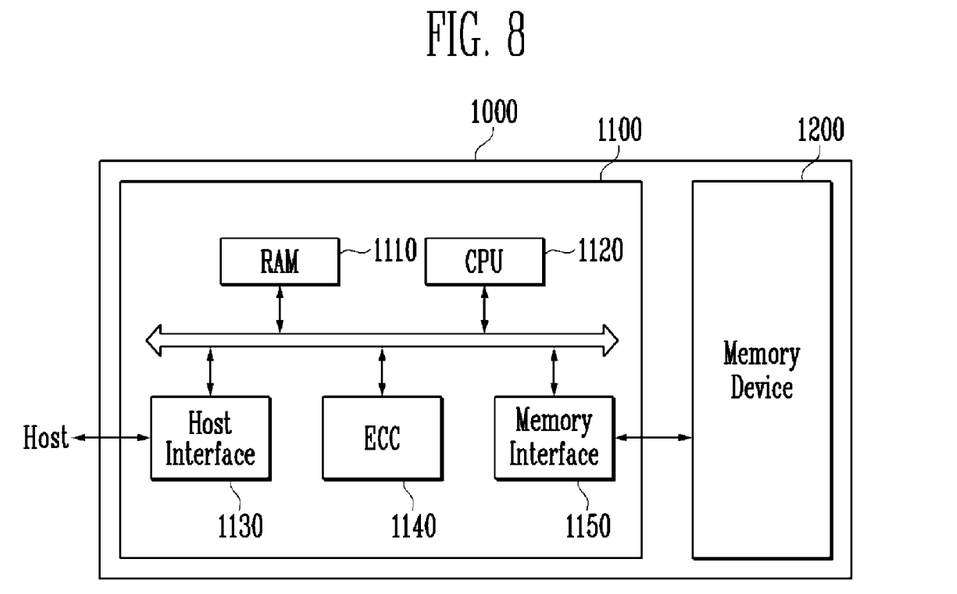
FIG. 8 is a block diagram illustrating a configuration of a memory system according to an embodiment of the present disclosure.

FIG. 8 is a block diagram illustrating a configuration of a memory system according to an embodiment of the present disclosure.

Referring to FIG. 8, the memory system 1000 according to an embodiment of the present disclosure includes a memory device 1200 and a controller 1100.

The memory device 1200 is used to store data information having various data types such as a text, a graphic, and a software code. The memory device 1200 may be a non-volatile memory. In addition, the memory device 1200 may be the semiconductor device described above with reference to FIGS. 2A, 2B, or 6, and may be manufactured according to the manufacturing method described with reference to FIGS. 3A to 5B. Because a structure of the memory device 1200 and a method of manufacturing the memory device 1200 are the same as described above, a detailed description thereof is not repeated here.

The controller 1100 is connected to a host and the memory device 1200 and is configured to access the memory device 1200 in response to a request from the host. For example, the controller 1100 is configured to control read, write, erase, and background operations, and the like of the memory device 1200.

The controller 1100 includes a random access memory (RAM) 1110, a central processing unit (CPU) 1120, a host interface 1130, an error correction code circuit 1140, a memory interface 1150, and the like.

Here, the RAM 1110 may be used as an operation memory of the CPU 1120, a cache memory between the memory device 1200 and the host, a buffer memory between the memory device 1200 and the host, and the like. For reference, the RAM 1110 may be replaced with a static random access memory (SRAM), a read only memory (ROM), or the like.

The CPU 1120 is configured to control overall operation of the controller 1100. For example, the CPU 1120 is configured to operate firmware such as a flash translation layer (FTL) stored in the RAM 1110.

The host interface 1130 is configured to perform interfacing with the host. For example, the controller 1100 communicates with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data read from the memory device 1200 using an error correction code (ECC).

The memory interface 1150 is configured to perform interfacing with the memory device 1200. For example, the memory interface 1150 includes a NAND interface or a NOR interface.

For reference, the controller 1100 may further include a buffer memory (not shown) for temporarily storing data. Here, the buffer memory may be used to temporarily store data transferred to the outside through the host interface 1130, or to temporarily store data transferred from the memory device 1200 through the memory interface 1150. In addition, the controller 1100 may further include a ROM that stores code data for interfacing with the host.

As described above, because the memory system 1000 according to an embodiment of the present disclosure includes the memory device 1200 having an improved degree of integration and an improved characteristic, a degree of integration and a characteristic of the memory system 1000 may also be improved.

Figure 9:
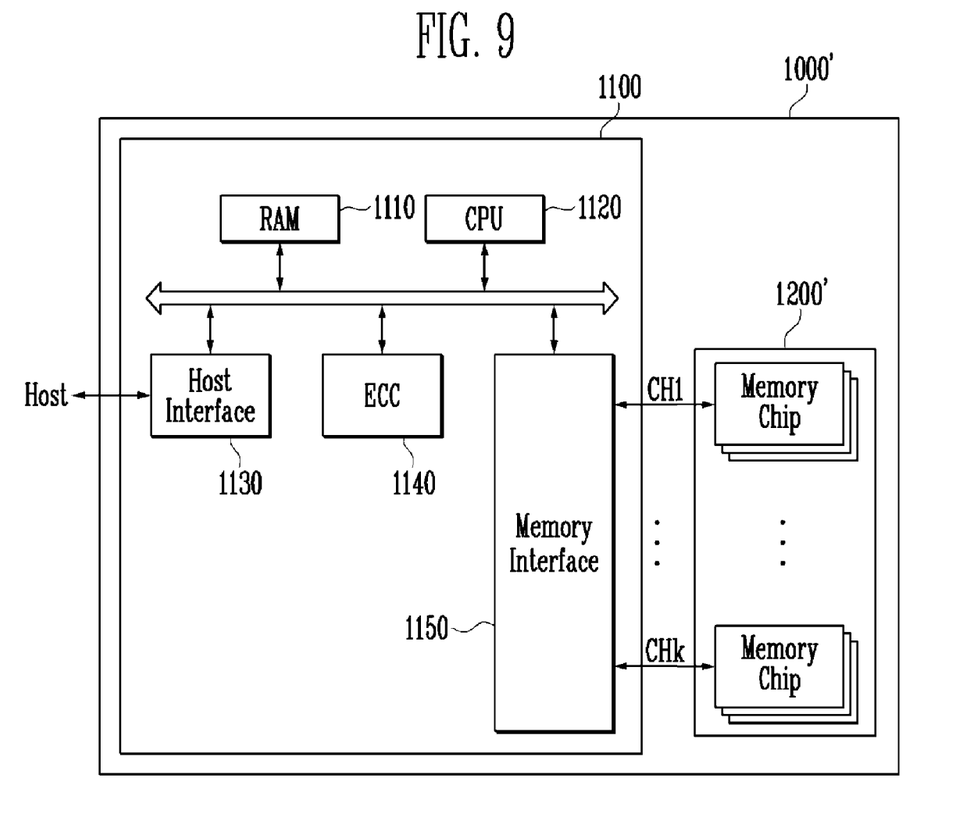
FIG. 9 is a block diagram illustrating a configuration of a memory system according to an embodiment of the present disclosure.

FIG. 9 is a block diagram illustrating a configuration of a memory system according to an embodiment of the present disclosure. Hereinafter, descriptions repetitive to the above description are not repeated.

Referring to FIG. 9, the memory system 1000' according to an embodiment of the present disclosure includes a memory device 1200' and a controller 1100. In addition, the controller 1100 includes a RAM 1110, a CPU 1120, a host interface 1130, an ECC circuit 1140, a memory interface 1150, and the like.

The memory device 1200' may be a non-volatile memory. The memory device 1200' may be the semiconductor device described above with reference to FIG. 2A, 2B, or 6, and may be manufactured according to the manufacturing method described with reference to FIGS. 3A to 5B. Because a structure of the memory device 1200' and a method of manufacturing the memory device 1200' are the same as described above, a detailed description thereof is not repeated here.

In addition, the memory device 1200' may be a multi-chip package configured of a plurality of memory chips. The plurality of memory chips are divided into a plurality of groups, and the plurality of groups are configured to communicate with the controller 1100 through first to k-th channels CH1 to CHk. In addition, the memory chips belonging to one group are configured to communicate with the controller 1100 through a common channel. For reference, the memory system 1000' may be modified such that one memory chip is connected to one channel.

As described above, because the memory system 1000' according to an embodiment of the present disclosure includes the memory device 1200' having an improved degree of integration and an improved characteristic, a degree of integration and a characteristic of the memory system 1000' may also be improved. In particular, by configuring the memory device 1200' in a multi-chip package, data storage capacity of the memory system 1000' may be increased and a driving speed may be improved.

Figure 10:
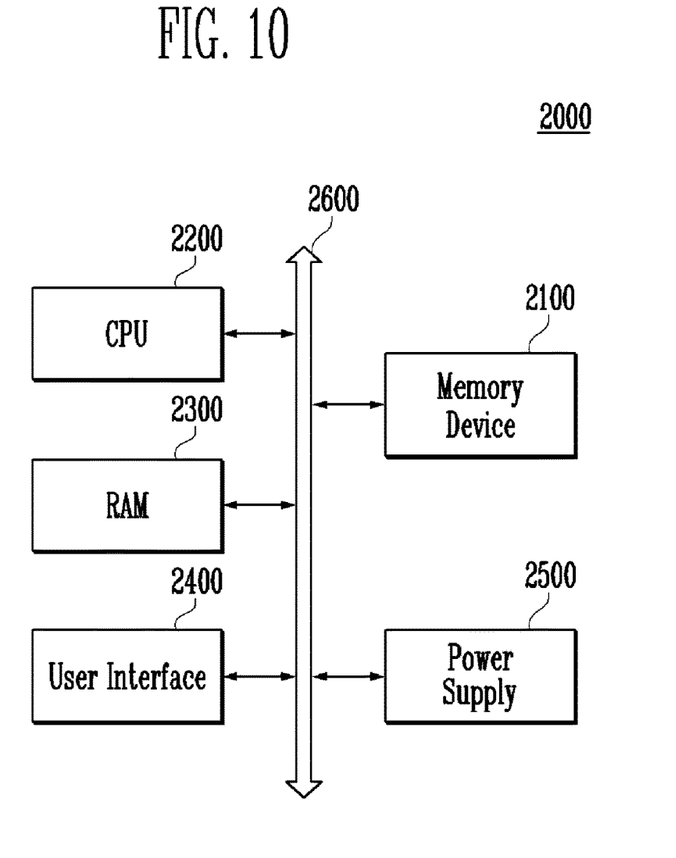
FIG. 10 is a block diagram illustrating a configuration of a computing system according to an embodiment of the present disclosure.

FIG. 10 is a block diagram illustrating a configuration of a computing system according to an embodiment of the present disclosure. Hereinafter, descriptions repetitive to the above description are not repeated.

Referring to FIG. 10, the computing system 2000 according to an embodiment of the present disclosure includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or may be directly connected to the system bus 2600. When the memory device 2100 is directly connected to the system bus 2600, a function of the controller may be performed by the CPU 2200, the RAM 2300, and the like.

Here, the memory device 2100 may be a non-volatile memory. The memory device 2100 may be the semiconductor device described above with reference to FIG. 2A, 2B, or 6, and may be manufactured according to the manufacturing method described with reference to FIGS. 3A to 5B. Because a structure of the memory device 2100 and a method of manufacturing the memory device 2100 are the same as described above, a detailed description thereof is not repeated here.

In addition, the memory device 2100 may be a multi-chip package including a plurality of memory chips as described with reference to FIG. 9.

The computing system having such a configuration may be a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or the like.

As described above, because the computing system 2000 according to an embodiment of the present disclosure includes the memory device 2100 having an improved degree of integration and an improved characteristic, a characteristic of the computing system 2000 may also be improved.

Figure 11:
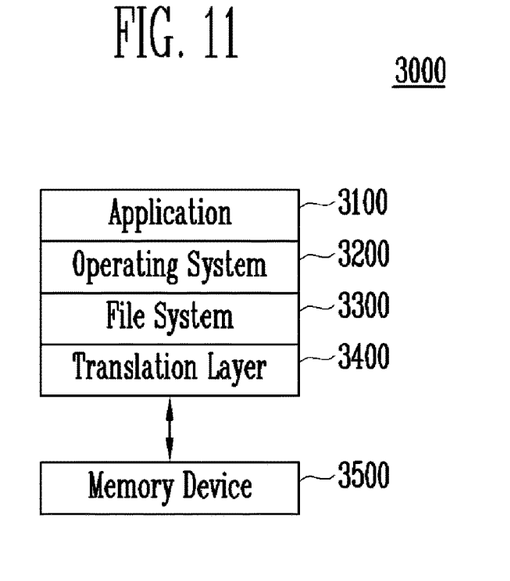
FIG. 11 is a block diagram illustrating a computing system according to an embodiment of the present disclosure.

FIG. 11 is a block diagram illustrating a computing system according to an embodiment of the present disclosure.

Referring to FIG. 11, the computing system 3000 according to an embodiment of the present disclosure includes a software layer including an operating system 3200, an application 3100, a file system 3300, a translation layer 3400, and the like. In addition, the computing system 3000 includes a hardware layer such as a memory device 3500.

The operating system 3200 is for managing software, hardware resources, and the like of the computing system 3000, and may control program execution of a central processing unit. The application 3100 may be various application programs executed on the computing system 3000 and may be a utility that is executed by the operating system 3200.

The file system 3300 refers to a logical structure for managing data, a file, and the like existing in the computing system 3000, and organizes the file or data to be stored in the memory device 3500 according to a rule. The file system 3300 may be determined according to the operating system 3200 used in the computing system 3000. For example, when the operating system 3200 is a Windows system of Microsoft company, the file system 3300 may be a file allocation table (FAT), an NT file system (NTFS), or the like. In addition, when the operating system 3200 is a Unix/Linux system, the file system 3300 may be an extended file system (EXT), a Unix file system (UFS), a journaling file system (JFS), or the like.

Although the operating system 3200, the application 3100, and the file system 3300 are shown as separate blocks in the present figure, the application 3100 and the file system 3300 may be included in the operating system 3200.

The translation layer 3400 converts an address in a form suitable for the memory device 3500 in response to a request from the file system 3300. For example, the translation layer 3400 converts a logical address generated by the file system 3300 into a physical address of the memory device 3500. Here, mapping information of the logical address and the physical address may be stored in an address translation table. For example, the translation layer 3400 may be a flash translation layer (FTL), a universal flash storage link layer (ULL), or the like.

The memory device 3500 may be a non-volatile memory. The memory device 3500 may be the semiconductor device described above with reference to FIG. 2A, 2B, or 6, and may be manufactured according to the manufacturing method described with reference to FIGS. 3A to 5B. Because a structure of the memory device 3500 and a method of manufacturing the memory device 3500 are the same as described above, a detailed description thereof is not repeated here.

The computing system 3000 having such a configuration may be divided into an operating system layer that is performed in a higher level region and a controller layer that is performed in a lower level region. Here, the application 3100, the operating system 3200, and the file system 3300 may be included in the operating system layer and may be driven by an operation memory of the computing system 3000. In addition, the translation layer 3400 may be included in the operating system layer or in the controller layer.

As described above, because the computing system 3000 according to an embodiment of the present disclosure includes the memory device 3500 having an improved degree of integration and an improved characteristic, a characteristic of the computing system 3000 may also be improved.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

Although the present disclosure has been described with reference to the limited embodiments and drawings, the present disclosure is not limited to the embodiments described above, and various changes and modifications may be made from the disclosed description by those skilled in the art to which the present disclosure pertains.

Therefore, the scope of the present disclosure should not be limited to the described embodiments, and should be determined by the equivalents of the claims as well as the following claims.

In the embodiments described above, all of the steps may optionally be performed or omitted. In addition, the steps in each embodiment need not occur in order, and may be reversed. Meanwhile, the embodiments of the present disclosure disclosed in the present specification and the drawings are merely specific examples for easily describing the technical content of the present specification and facilitating understanding of the present specification and do not limit the scope of the present specification. That is, it is apparent to those skilled in the art to which the present disclosure pertains that other modification examples based on the technical spirit of the present disclosure are possible.

Meanwhile, the present specification and drawings disclose a preferred embodiment of the present disclosure. Although specific terms are used, they are used in general meaning for purposes of easily describing technical content of the present disclosure and facilitating understanding of the present disclosure, and are not intended to limit the scope of the present disclosure. It is apparent to those skilled in the art to which the present disclosure pertains that other modification examples based on the technical spirit of the present disclosure may be carried out in addition to the embodiments disclosed herein.

What is claimed is:

1. A semiconductor device comprising:
   a first stack including first interlayer insulating layers and first conductive patterns which are alternately stacked with one another;
   a second stack including second interlayer insulating layers and second conductive patterns which are alternately stacked with one another on the first stack;
   a plurality of channel plugs at least partially passing through the first stack and the second stack and extending in a vertical direction;
   at least one dummy plug at least partially passing through the second stack without passing through the first stack; and
   first and second slits at least partially passing through the first stack and the second stack,
   wherein the at least one dummy plug is disposed in a region adjacent to the first and second slits.

2. The semiconductor device of claim 1, wherein the plurality of channel plugs are regularly arranged to be spaced apart from each other by a predetermined distance.

3. The semiconductor device of claim 2, wherein the at least one dummy plug is arranged in an outermost corner region of a region where the plurality of channel plugs are arranged.

4. The semiconductor device of claim 1, wherein the plurality of channel plugs and the at least one dummy plug are interposed between the first and second slits.

5. The semiconductor device of claim 1, wherein the channel plugs and the at least one dummy plug each comprise:
   a gap fill film;
   a channel film surrounding the gap fill film; and
   a memory film surrounding the channel film.

6. The semiconductor device of claim 1, wherein a lower portion of the at least one dummy plug is in contact with an uppermost film of the first stack.

7. A semiconductor device comprising:
   a first stack including first interlayer insulating layers and first conductive patterns which are alternately stacked with one another;
   a second stack including second interlayer insulating layers and second conductive patterns which are alternately stacked with one another on the first stack;
   a plurality of channel plugs at least partially passing through the portion or the entirety of the first stack and the second stack and extending in a vertical direction;
   at least one dummy plug at least partially passing through the second stack without passing through the first stack ; and first and second slits at least partially passing through the portion or the entirety of the first stack and the second stack, wherein the plurality of channel plugs and the at least one dummy plug include same material layers.

8. The semiconductor device of claim 7, wherein the plurality of channel plugs are regularly arranged to be spaced apart from each other by a predetermined distance.

9. The semiconductor device of claim 8, wherein the at least one dummy plug is arranged in an outermost corner region of a region where the plurality of channel plugs are arranged.

10. The semiconductor device of claim 7, wherein the plurality of channel plugs and the at least one dummy plug are interposed between the first and second slits.

11. The semiconductor device of claim 8, wherein the channel plugs and the at least one dummy plug each comprise:
  a gap fill film;
  a channel film surrounding the gap fill film; and
  a memory film surrounding the channel film.

12. The semiconductor device of claim 8, wherein a lower portion of the at least one dummy plug is in contact with an uppermost film of the first stack.

* * * * *